United States Patent [19]
Bernstein et al.

[11] Patent Number: 6,057,221

[45] Date of Patent: May 2, 2000

[54] LASER-INDUCED CUTTING OF METAL INTERCONNECT

[75] Inventors: Joseph B. Bernstein, Potomac, Md.; Zhihui Duan, Erie, Pa.

[73] Assignees: Massachusetts Institute of Technology, Cambridge, Mass.; University of Maryland, College Park, Md.

[21] Appl. No.: 08/825,808

[22] Filed: Apr. 3, 1997

[51] Int. Cl.[7] .................................................. H01L 21/44
[52] U.S. Cl. ............................................. 438/601; 438/132
[58] Field of Search ..................................... 438/601, 132

[56] References Cited

U.S. PATENT DOCUMENTS

| | | | |
|---|---|---|---|
| 3,959,047 | 5/1976 | Alberts et al. | 156/8 |
| 4,198,744 | 4/1980 | Nicolay . | |
| 4,259,367 | 3/1981 | Dougherty, Jr. | 427/96 |
| 4,682,204 | 7/1987 | Shiozaki et al. . | |
| 4,720,470 | 1/1988 | Johnson | 437/173 |
| 4,748,491 | 5/1988 | Takagi | 357/51 |
| 4,849,363 | 7/1989 | Coffey et al. | 437/19 |
| 4,853,758 | 8/1989 | Fischer | 357/51 |
| 5,070,392 | 12/1991 | Coffey et al. | 357/71 |
| 5,134,585 | 7/1992 | Murakami et al. | 365/200 |
| 5,265,114 | 11/1993 | Sun et al. | 372/69 |
| 5,374,590 | 12/1994 | Batdorf et al. | 437/173 |
| 5,471,427 | 11/1995 | Murakami et al. | 365/200 |
| 5,473,624 | 12/1995 | Sun | 372/69 |
| 5,578,517 | 11/1996 | Yoo et al. | 437/60 |
| 5,589,706 | 12/1996 | Mitwalsky et al. | 257/529 |
| 5,608,257 | 3/1997 | Lee et al. . | |
| 5,882,998 | 12/1996 | Sur, Jr. et al. . | |

FOREIGN PATENT DOCUMENTS 62-162344  7/1987  Japan .

OTHER PUBLICATIONS

Cohen, S., et al., "Laser–Induced Line Melting and Cutting," *IEEE Transactions on Electron Devices*, Nov. 1992, at 2480–2485.

Wu, W., "Laser Connection and Disconnection Scheme," IBM Technical Disclosure Bulletin, Jun. 1978, at 268.

*Primary Examiner*—Richard Booth
*Assistant Examiner*—Jonathan Hack
*Attorney, Agent, or Firm*—Hamilton, Brook, Smith & Reynolds

[57] ABSTRACT

An electrical interconnect includes a substrate having an insulating surface upon which is placed an electrically-conductive cut-link pad and a pair of electrically-conductive lines. The lines are bonded to the cut-link pad and are substantially more resistant to heat flow per unit length than is the cut-link pad. In a preferred embodiment, the thermal resistance per unit length of the cut-link pad is lowered by designing the pad such that its width is greater than the width of either of the lines. A method for cutting a circuit includes directing a laser upon the cut-link pad of an interconnect, as described above. The laser is maintained upon the pad until the cut-link pad is ablated, severing the circuit.

21 Claims, 6 Drawing Sheets

LASER-INDUCED CUTTING OF METAL INTERCONNECT

GOVERNMENT SUPPORT

This invention was made with government support under Contract number F19628-95-C-0002, awarded by the United States Air Force. The government has certain rights in the invention.

BACKGROUND OF THE INVENTION

The use of lasers to cut integrated circuits is well-known in the art. In existing methods, a laser is directed onto a cut-link segment of the circuit. The laser supplies sufficient heat to vaporize the cut-link, thereby severing the cut-link. In many cases such as in a typical microchip, the circuit is coated with a passivation layer to protect the circuit from oxidation. To allow the cut-link to vaporize, the passivation layer is usually etched away from the site above the cut-link to expose the cut-link to the atmosphere in advance of cutting.

Lasers are used to cut circuits for a variety of purposes including the avoidance of defects, the replacement of defective circuits with redundant circuits, and the programming of circuits. The practices used to achieve each of these objectives are described, below.

Lasers have been used to avoid defects by circumventing a short through laser-induced cuts. This practice is described in U.S. Pat. No. 4,259,367, issued to Doherty, Jr. The circuit is repaired by using a laser to cut the lines connected to the short to thereby isolate the short. Patch lines may then be used to reestablish severed connections.

The use of redundant circuitry has become an industry standard for memory chip fabrication. Redundant circuitry in a chip is typically supplied in the form of identical segments of circuitry occupying remote areas on the chip. If a segment is flawed, that segment is disconnected and replaced by activating its redundant counterpart elsewhere on the chip.

Finally, circuits may be programmed by cutting lines from a generic, repeating pattern to disconnect unwanted or unnecessary segments and thereby produce the desired pattern through a process of reduction. Circuitry produced by this method may extend across a plurality of levels as well. One example of multi-level circuit design by laser-induced cutting is disclosed in U.S. Pat. No. 4,720,470, issued to Johnson.

Typically, the cut-link has taken one of two forms. First, the cut-link is often an undistinguished segment of a line in the circuit, where the width of the cut-link is equal to the width of the lines to which it is conductively coupled. A cut-link exhibiting these characteristics is illustrated in FIG. 1 and disclosed, for example, in the following U.S. Pat. Nos.: No. 4,853,758, issued to Fischer, and No. 5,589,706, issued to Mitwalsky et al. The second common form is that of a "dog bone," which is illustrated in FIG. 2. This design is disclosed, for example, in the following U.S. Pat. Nos.: No. 4,748,491, issued to Takagi, and No. 5,374,590, issued to Batdorf et al. In this design, the cut-link 20 is narrower than the lines 21, 22 to which it is connected.

DISCLOSURE OF THE INVENTION

Whereas the design of earlier cut-links mirrors the narrowed "dog-bone" of conventional fuse design, a preferred embodiment of this invention rejects this model and, instead, widens the segment where the circuit is to be severed. Where circuitry is cut by a laser, the high resistance of a fuse is not required to produce the needed influx of thermal energy. In this context, the thermal energy needed to melt the conductive material is supplied by an external source, i.e., the laser. As the present inventors have recognized, the use of the laser frees the designer from the necessity of using a high resistance segment to generate the heat necessary to cut the circuit. Although intuition might further suggest that a fuse-shaped cut-link of thin width could be severed with greater precision and efficiency than an otherwise comparable cut-link of greater width, the present inventors have recognized that this notion is generally false.

To the contrary, an electrical interconnect which may be cut with greater success and with improved efficiency includes a cut-link pad in which the thermal resistance per unit length is lower, rather than higher, than the connected lines. In a preferred embodiment, the thermal resistance is lowered by adopting a form that is the inverse of the traditional "dog bone" design. The form of this new design is such that the width of the cut-link pad is substantially greater than the width of the lines.

The electrical interconnect of this invention includes an insulating substrate upon which a pair of electrically-conductive lines are bonded to a cut-link pad, wherein the cut-link pad has substantially less thermal resistance per unit length, i.e., along the axis of the lines, than each of the lines to which it is bonded. The cut-link pad may lie in the same plane as the lines, or the pad may lie on a plane which is merely intersected by the lines, as in a via structure where the lines, or vias, extend from the underside of the pad into the substrate to a lower level of circuitry. Alternatively, the cut-link pad may be bonded both to a line on the same plane as the pad and also to a via extending from the pad deeper into the substrate.

In a preferred embodiment of the electrical interconnect, the thermal resistance of the pad is decreased, relative to the lines, by increasing the width of the pad such that the pad's width is greater than that of the lines to which it is connected. Benefit is provided in an interconnect where the cut-link pad is just 10 percent greater than the width of each of the lines. Benefits rise in significance when the pad has a width that is at least 25 percent greater than the width of each of the lines. The full advantage of this embodiment, however, is usually not realized until the width of the pad is at least 50 percent greater than the width of each of the lines. In a further preferred embodiment, the width of the pad is approximately equal to its length, i.e., the distance between the lines.

In an alternative embodiment, the thermal resistance of the pad is decreased, relative to the lines, by comprising the cut-link pad of a material having lower thermal conductivity than the material comprising the lines. In another alternative embodiment, the per-unit-length thermal resistance of the pad is decreased both by comprising the cut-link pad of a material having greater thermal conductivity than the material of the lines and by providing the pad with a width greater than that of the lines.

In another preferred embodiment, the surface of the substrate upon which the circuit lies is comprised of a silicon oxide, and the circuit is covered by a passivation layer which prevents oxidation of the circuit yet which can be removed from the site of the cut-link pad upon heating the pad with the laser. To promote the desired fracture of the passivation layer, the passivation layer is preferably comprised of a material, such as silicon nitride, that is harder than the substrate.

In the method of this invention a laser is directed upon a cut-link pad, as described above, and the laser is maintained there until the conductive link between the lines is broken. Preferably, the laser beam covers the entirety of the cut-link pad when the laser is directed upon the pad.

The metallic cut-link pads of the present invention can be more efficiently and more effectively ablated for the following reasons. First, the structures of the present invention retain thermal energy at the site of the cut-link more effectively than the cut-links of the prior art by restricting dissipative heat transfer from the cut-link into the connected lines. Second, the shapes of preferred structures produce increased stress at the perimeter of the cut-link pad, thereby generating a more forceful fracture of the surrounding material. Third, the shapes of preferred structures create stress concentration points that will produce fractures radiating outwardly from the site of the cut-link pad, thereby improving the likelihood that the fracture will be clean, i.e., will not create inter-linked fracture passages through which escaping metal may form a "short" defeating the attempt to cleanly sever the circuit. Fourth, where the cut-link pad more closely approximates the size and shape of the laser beam, the cut-link absorbs a greater portion of the laser's energy, thereby producing a more efficient transfer of energy and a reduced danger of damaging the surrounding material. Fifth, where a passivative coating comprised of a brittle material is used, the fracture is biased toward the passivative coating, and, hence, toward the surface of a chip for efficient removal of the passivative coating and non-damaging expulsion of the metal comprising the cut-link pad. Sixth, by trapping the heat within the confines of the cut-link pad and limiting its escape through the connected lines, the site at which the cut develops is confined within this narrow region and damage to other parts of the circuit is minimized. Each of these phenomena will be discussed in greater detail and with greater clarity in the context of describing the structure and methods of several preferred embodiments of this invention.

BRIEF DESCRIPTION OF THE DRAWINGS

The foregoing and other objects, features and advantages of the invention will be apparent from the following, more particular description of preferred embodiments of the invention, as illustrated in the accompanying drawings in which like reference characters refer to the same parts throughout the different views. The drawings are not necessarily drawn to scale, emphasis instead being placed upon illustrating the principles of the invention.

DETAILED DESCRIPTION OF PREFERRED EMBODIMENTS

Figure 1:
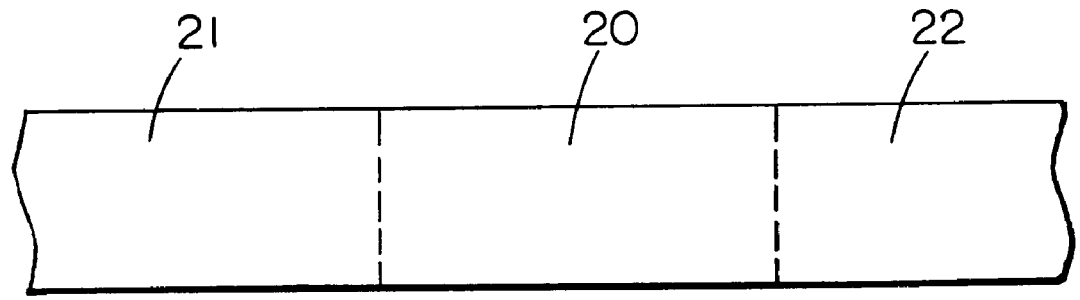
FIG. 1 is a cross-sectional illustration of a cut-link pad of the prior art, from a perspective normal to the plane of the substrate, where the width of the pad is equal to the width of the lines.
Figure 2:
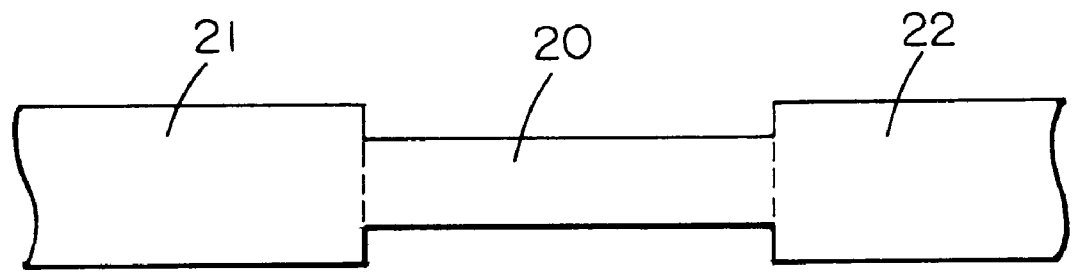
FIG. 2 is a cross-sectional illustration of a cut-link pad of the prior art, from a perspective normal to the plane of the substrate, where the interconnect has the shape of a dog bone.
Figure 3:
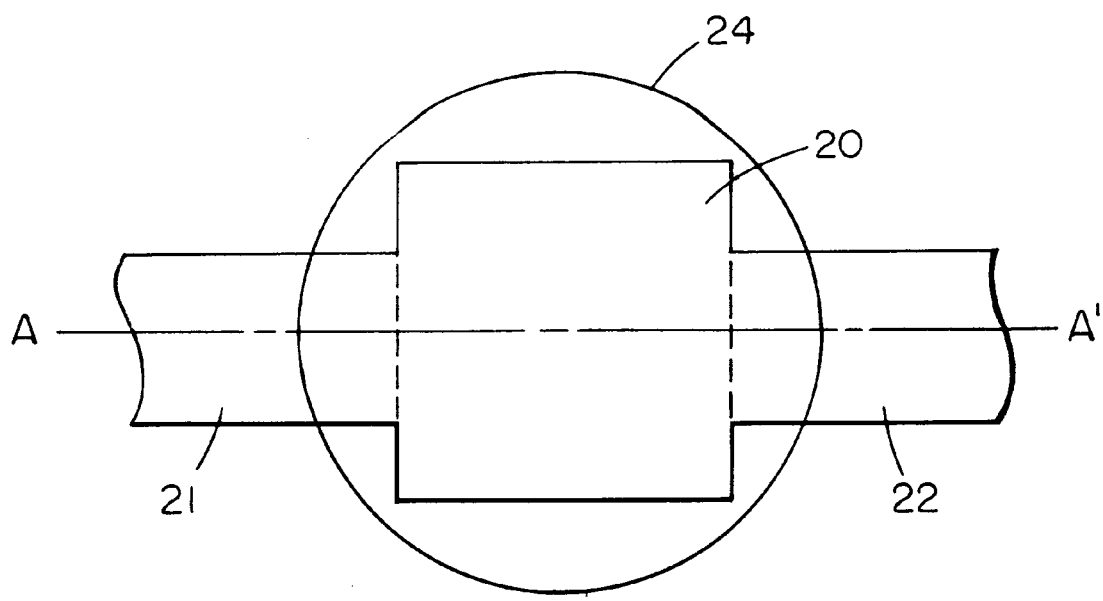
FIG. 3 is a cross-sectional illustration of a cut-link pad in the form of a square, from a perspective normal to the plane of the substrate, where the width of the pad is greater than the width of each of the lines.

A cut-link shaped in the form of a square pad is illustrated in FIG. 3. The cut-link pad 20, is bonded to a pair of lines 21 and 22, each positioned on the substrate of a chip or circuit board within a single plane. The pad and the lines are all electrically conductive, whereas that part of the substrate that contracts the metal is dielectric. Although this embodiment could just as fairly be described as a single line including a cut-link site, the embodiment is herein broken down into narrower constituents to provide greater clarity when different embodiments are discussed and differentiated, below. As can be seen by juxtaposing the cut-link of this figure with those illustrated in FIGS. 1 and 2, the cut-link pad of FIG. 3 has a much greater width in relation to the width of each of the attached lines. The reasons for widening the cut-link are explained below.

First, ablation, or rupture, of the cut-link requires an accumulation of thermal energy within the cut-link. During cutting, the accumulation of thermal energy within the link can be roughly measured as the difference between the energy supplied by the laser and the heat conductively transferred out of and away from the cut-link. Therefore, the cut-link can be ablated from its site most efficiently by maximizing the absorption of laser energy and minimizing the transfer of that energy, in the form of heat, away from the cut-link.

The amount of laser energy absorbed by the cut-link is maximized by providing a cut-link shaped in a form approximating that of the laser beam spot 24. Although the shape of the beam spot is Gaussian, i.e., no clear delineation exists for identifying the outer edge of the spot; the position of the edge may be approximated using, for example, the full-width half-max method. Using the full-width half-max method, the edge of the spot is designated as the boundary at which the intensity of the laser drops to half of the maximum intensity. When cutting, the cut-link should ideally be entirely within the beam spot as determined above. Absorption across the entire surface promotes uniform heating of the pad. An infrared laser typically produces beams having a minimum diameter of about two microns. Further, the tolerance for beam positioning error is typically about 0.2 to 0.5 microns. Accordingly, a pad designed to have a preferable length and width of two to three microns can absorb the bulk of the energy transmitted by the laser while remaining entirely within the beam spot.

Figure 4:
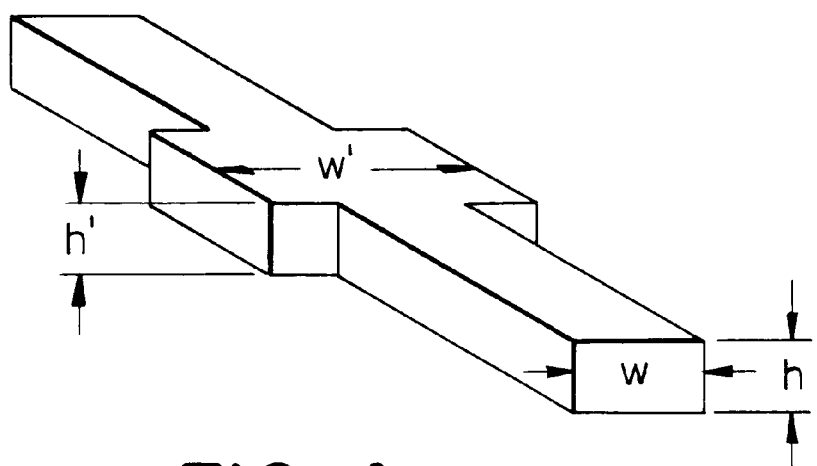
FIG. 4 is a perspective view of the cut-link pad and the lines shown in FIG. 3.

Transfer of heat away from the cut-link is minimized by creating a comparatively-lower thermal resistance per unit length within the pad than without. Because the top layer of the substrate and any passivative coating are insulators, the primary mode through which heat is transferred from the pad is through the connected lines. Accordingly, the direction of heat transfer out of the pad can be approximated as being along axis A-A', shown in FIG. 3. Along axis A-A', thermal resistance is a function of the heat transfer coefficient of the conducting material and the cross-sectional area of the conducting material measured in the plane normal to the axis. The pad and the lines are preferably comprised of a material with high thermal conductivity and high thermal expansion, such as aluminum and copper. In such a case, where the composition of the pad is identical to the composition of each of the lines, a differential in thermal resistance is due primarily to a difference in cross-sectional area. The dimensions of the cross-section normal to the A-A' axis are illustrated in FIG. 4. As shown, the cross-section of the line (the product of w and h) is much smaller than the cross-section of the pad (the product of w' and h'). Accordingly, the thermal resistance along the A-A' axis will be much greater in each of the lines than in the pad. This differential reduces the loss of heat into and through the line and thereby allows the temperature of the pad to quickly rise.

Moreover, the difference in thermal resistance produces a sharp temperature differential between the pad and the lines to create stress at the interface which promotes a clean severance at the interface between the pad and the line. The difference in thermal resistance also creates a boundary limiting the area within which fracture will occur. I.e., fracture will not initiate from a comparatively cool region beyond the area where heat is concentrated. The differential on each side of the pad thereby ensures that fracture will commence from the pad, rather than from a line, providing greater cutting accuracy and minimizing damage to the surrounding circuitry.

Means other than increasing the width of the pad exist for creating a differential in thermal resistance at the interface of the pad and the line. For example, in one embodiment, the pad may be fabricated from a material having greater thermal conductivity than the material from which the lines are comprised. In another alternative embodiment the pad may be both wider than the lines and comprised of a material having greater thermal conductivity than the lines.

Figure 5:
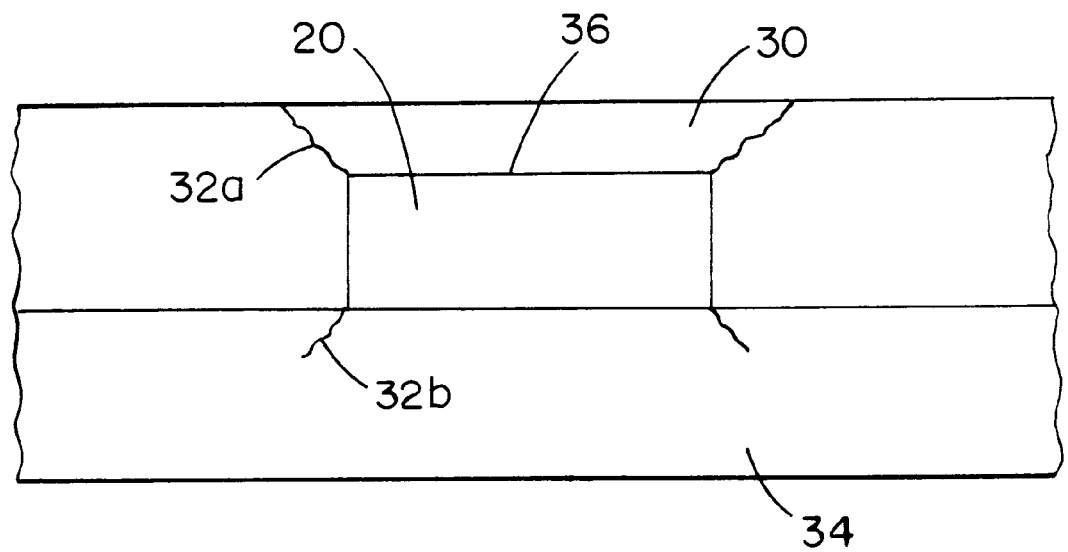
FIG. 5 is a cross-sectional illustration of a cut-link pad, from a perspective within the axis of the lines, illustrating the fractures which typically form during cutting.
Figure 6:
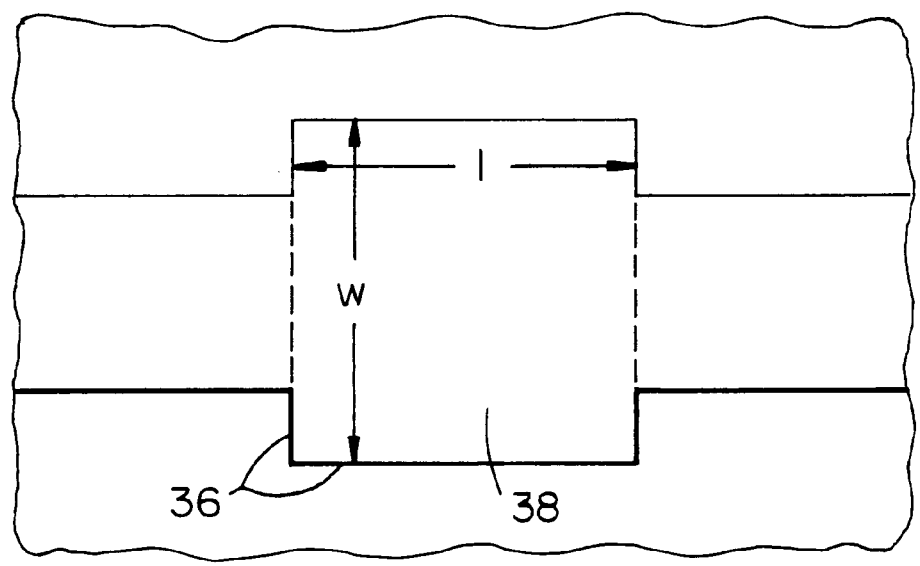
FIG. 6 is a cross-sectional illustration of a cut-link pad in the form of a square, from a perspective normal to the plane of the substrate, where the width of the pad is greater than the width of each of the lines.

In addition to improving the absorption and retention of thermal energy from the laser, creating a roughly square-shaped pad reduces the likelihood of producing a short circumventing the cut. As noted, the metal from the cut site escapes through fractures in the passivation layer. After or during a cut, the circuit will be shorted if metal migrates through the fractures to provide a continuous link from one line to the other. Because a comparatively large void is left after the ablation of a wide, square cut-link, the passage created by a fracture and the accompanying flow of metal linking the two lines must cover a greater distance to circumscribe the two lines must cover a greater distance to circumscribe the void and create a short. Further, cracks generated in the horizontal plane on which the circuit lies will typically emanate from the corners where stress is concentrated. As is shown in FIG. 5, cracks 32a and 32b emanating from the edges 36 of a square-shaped pad 20 will typically be directed outward at an angle of 135° from the sides of the pad 20 mitigating the likelihood that cracks from opposite sides of the pad will cross to create a passage for forming a short.

Designing the cut-link pad to approximate the size and shape of the laser beam spot also provides an additional benefit. Less energy misses the cut-link pad resulting in less energy being absorbed into the surrounding dielectric material which reduces the likelihood that this surrounding material will be damaged by thermal stresses.

Both the lines and the cut-links 20 in a circuit are coated with a passivation layer 30 to protect the circuit from oxidation as a result of exposure to air. For the cut-link 20 to be ablated, fractures 32 must be created within the passivation layer 30, which allow the section of passivation layer 30 covering the cut-link 20 to be blasted away from the chip, thereby exposing the cut-link 20 to air and allowing it to vaporize. Preferably, a hard, brittle material, such as silicon nitride is used as the passivation layer 30 because increasing hardness and brittleness is correlated with increasing susceptibility to fracture. When a laser pulse is incident on the cut-link pad 20, the cut-link pad 20 is heated and expands. The passivation layer 30 can not be heated as quickly as the metal lines because the passivation layer 30 can not absorb energy from the laser beam directly and can not conduct heat from the metal quickly. As a result, stress develops within the passivation layer 30 due to the difference in temperature between the metal 20 and the passivative coating 30 as well as the mismatch of the thermal expansion coefficients of the two materials. As the metal 20 expands with increasing temperature, greater tensile stress is placed on the passivative coating 30, which is why choosing a metal having a high thermal expansion coefficient is important. When the stress is sufficiently great, the passivative coating 30 is blasted from the area above the cut-link 20, and the cut-link 20 vaporizes into the open space above it.

Typically, the substrate 34 of a chip includes a silicon wafer base upon which a dielectric material, such as a silicon oxide, is layered. The circuit is then imprinted onto the dielectric material. Because silicon nitride is more brittle than silicon oxide, fracture initiation is biased toward the silicon nitride. By promoting fracture through the passivation layer 30, rather than through the substrate 34, the metal is more likely to be completely ablated from the chip, and the likelihood of forming a short through the substrate is reduced. Though not as brittle as silicon nitride, silicon oxide is also sufficiently brittle to be sued as the passivation layer 30.

Increasing the width of the cut-link also improves the fracture mechanics during ablation. The fracture initiates and grows as a result of thermal stress at the interface of the cut-link and the surrounding material. The thermal stress, in turn, is a function of the energy density at the surface of the pad. The lines of maximum stress, from which fractures typically propagate, are along the edge 36 of the pad 20 forming the perimeter of the surface 38 facing the passivation layer 30. The energy density along the maximum stress lines 36 is governed by the ratio of the energy absorbed to the length of the perimeter.

Making the approximating assumption that the energy density of the laser beam is uniform, the energy absorbed by a square surface 38 will be the produce of k and S, where k is a constant and S represents the area of surface 38. The energy density, $E_p$, along the perimeter, P, of the surface 38 can be expressed by the function:

$$E_p = k * S/P$$

As the energy density increases, the stresses increase and the cracks grow. Energy density increases as a result of increasing the surface dimensions of the pad. As the dimensions increase, the area of the square, S (S=1 *w), increases as a square function while the length of the perimeter, P [P=2 * (1+w)], increases linearly. Accordingly, S will increase at a quadratic rate while P increases at a linear rate. Because the numerator of the energy-density function increases with size at a rate faster than the denominator, a fracture driven by a large, square-shaped cut-link will propagate through the passivation layer with greater energy than a fracture driven by a small or narrow cut-link.

Of course, fracture will initiate from an edge of the outer surface because stress is concentrated at the edges. Use of a wider cut-link promotes fracture 32a from an edge 36 of the upper surface of the cut-link rather than fracture 32b from the lower surface facing toward the silicon wafer. After the fracture 32a has propagated through the passivation layer 30, this segment of the passivation layer 30 can be "blown off" by the escaping metal, as desired. In contrast, fracture 32b commencing from the lower side can damage interconnects existing on lower levels of a chip, and the metal flowing through a fracture directed toward the silicon has no outlet and is therefore more likely to produce a short. Therefore, the likelihood of producing a clean severance of an interconnect is promoted by the wider cut-links because fracture is biased toward the passivation layer and away from the silicon wafer.

Figure 7:
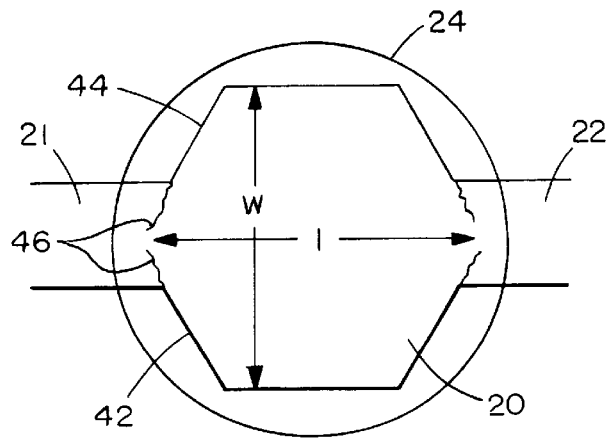
FIG. 7 is a cross-sectional illustration of a hexagonally-shaped cut-link pad from a perspective normal to the plane of the substrate.

Although a preferred shape of the cut-link pad is square, other relatively compact shapes approximating the size and shape of the laser beam spot may also be used. FIG. 7 illustrates a hexagonally-shaped pad of this invention. As before, the width, w, of the pad is approximately equal to the length, l, of the pad. Although this hexagonal design is more compact and provides a better approximation of the laser beam shape 24, as compared to a square pad, the crack 46 must propagate across a longer distance to cross the interface between the line 21 and the pad 20. As the energy density builds along the edges 42 and 44, the pad 20 is severed from the line 21 when cracks 46, which parallel the edges 42, 44, branch across the interface.

Figure 8:
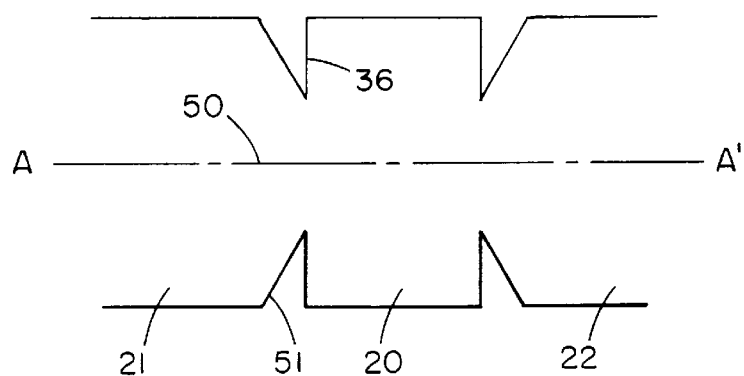
FIG. 8 is a cross-sectional illustration of an electrical interconnect, from a perspective normal to the plane of the substrate, where the width of each of the lines is equal to the width of the cut-link pad, except in the vicinity of the juncture between the line and the pad, where the width of the line narrows.
Figure 9:
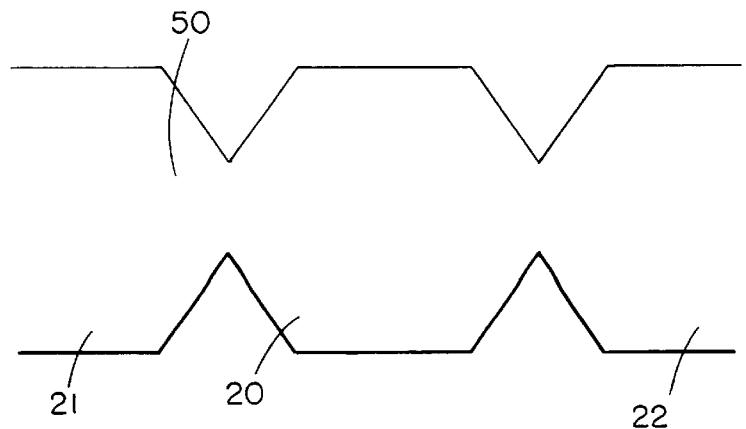
FIG. 9 is a cross-sectional illustration similar to FIG. 8, except that the cut-link pad is in the form of a hexagon, rather than a square.

Although each of the single-plane embodiments thus far described includes lines having widths uniformly narrower than the width of the cut-link pad, the width of the lines need not be uniform to provide benefit. FIGS. 8 and 9 illustrate embodiments wherein the cut-link and the lines 21 and 22 possess equal widths over much of their lengths. The width of each line 21, 22 narrows only as it approaches and where it meets the pad 20. Because the juncture of the line 21, 22 and the pad 20 is narrow, thermal resistance along the A-A' axis increases at the juncture relative to the resistance within the pad, as in the previous embodiments. However, the overall ability to restrict heat flow out of the pad 20 may be somewhat compromised if the width beyond the bottleneck 50 is enlarged, as shown, because the resistance in the line 21 or 22 drops to the level within the pad 20 at points beyond the bottleneck 50. Accordingly, heat can be rapidly withdrawn once it passes through the bottleneck 50 creating a more precipitous temperature drop across this interface thereby fueling the conduction of heat out of the pad 20.

Another advantage of the patterns illustrated in FIGS. 8 and 9 is that the fracture along the interface of the pad 20 and the line 21 or 22 is enhanced. As noted above, fractures across the interface will typically emanate along a line substantially parallel to the edge 36 of the pad 20. In the pattern shown in FIG. 3, the edge of the line meets the edge of the pad perpendicularly. Accordingly, the stress along the edge of the line is perpendicular to the direction in which the interfacial fracture will propagate and will provide little or no impetus toward initiating or driving this fracture. On the other hand, the edge 51 of the line 21 in FIG. 8 slopes toward the edge 36 of the pad 20. In proportion to the component of this slope which parallels the edge 36 of the pad 20, the stress along the edge 51 of the line 21 will supplement the stress along the edge 36 of the pad 20 to initiate and drive the fracture across the interface between the pad 20 and the line 21.

Figure 10:
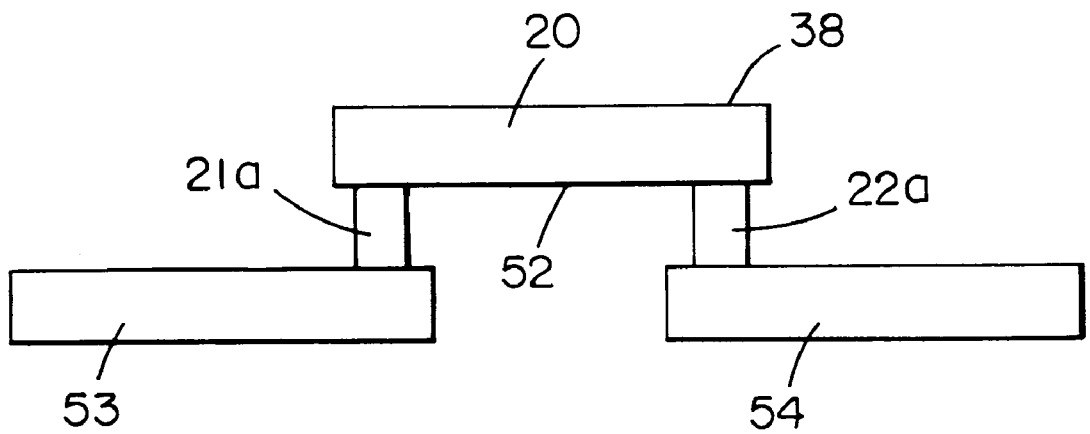
FIG. 10 is a side-view, through the substrate, of a multi-level via structure from a perspective within the plane of the substrate.
Figure 11:
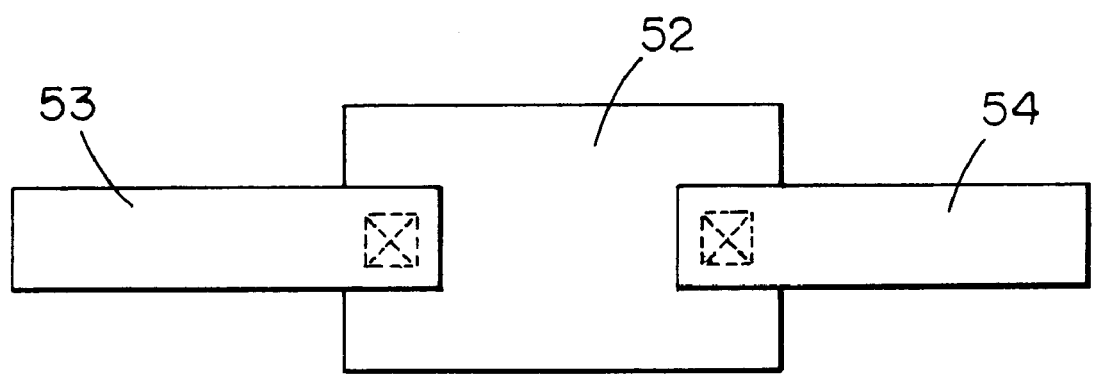
FIG. 11 is a view of the multi-level circuit of FIG. 10 from underneath the via structure.

In contrast to the embodiments thus described, wherein the pad and the lines all lie within the same plane of a chip or circuit board, the invention may also be embodied in multi-layered chips. Such an embodiment is illustrated in FIGS. 10 and 11. As before, the orientation of the pad 20 is parallel to the plane of the chip. However, in place of the laterally-extending lines, the lines take the form of vias 21a and 22a extending downward from the surface 52 of the pad 20 away from the laser and into the substrate. These vias 21a and 22a provide a conductive link between levels of the integrated circuit. Typically, the vias 21a and 22a have a smaller cross-section than the lines of the single-level embodiments. Where half-micron technology is used in standard silicon processing, the via 21a or 22a preferably has a width of about a half micrometer across its cross-section. The vias 21a and 22a are conductively coupled to the pad 20, which forms a conductive cap stretching across and conductively bonded to the upper end of each via 21a, 22a. At their ends opposite the pad 20, the vias 21a and 22a are conductively bonded to lines 53, 54 extending laterally in a layer beneath the pad 20. By removing the pad 20 through laser ablation, the conductive link is broken.

When the laser strikes the pad 20, heat migrates downward away from surface. During the first few nanoseconds after the laser strikes, the temperature at the bottom 52 of the pad is much lower than the temperature at the top surface 38. As a result, less heat is dissipated through the vias 21a, 22a than if they were laterally connected, and the efficiency with which the cut is performed is thereby improved.

In either a single-layer or multi-layer embodiment of the electrical interconnect, the method for ablating the cut-link pad is substantially identical. First, a laser beam having an intensity on the order of 10 Joules per square centimeter is directed onto the site of the pad. When embodied in a chip, the pad is typically coated with a passivation layer. The beam must be able to pass through the passivation layer, which is preferably silicon nitride, and be absorbed by the metal of the cut-link pad. The wavelength of the laser beam is determined by what is transmittable through the passivation layer. Each material has an upper limit as to the size of the wavelength that it is capable of absorbing. For silicon nitride, that limit is about a half micrometer. Therefore, an infrared laser producing a beam with a wavelength of about one micrometer may be used to transmit energy through the silicon nitride layer to the underlying metallic cut-link pad where it is absorbed.

The laser generates a beam in the form of a pulse or a series of pulses. The duration of the pulse is determined by the thickness of the pad and the rate of thermal diffusion through the pad. With these variables in mind, the pulse should be of sufficient duration for the heat to diffuse through the entirety of the pad. For the embodiments thus far described, a pulse of 5 to 10 nanoseconds is generally sufficient to produce a clean severance without damage to the circuit.

Damage can occur when too much energy is directed at the cut-link site. Specifically, excessive energy is created by a pulse having excessive intensity or excessive duration. On one hand, the pulse and duration must be sufficiently great to supply ample energy to initiate and drive the fracture severing the pad from the lines and expelling the overlying passivation layer. The remaining energy must by sufficient to vaporize the cut-link pad and produce a substantially vacant cavity at the former site of the pad. If too much energy is provided, however, a crack 32b can propagate, as shown in FIG. 5, from the lower corner of the pad 20 through the dielectric material and damage the underlying circuitry.

Figure 12:
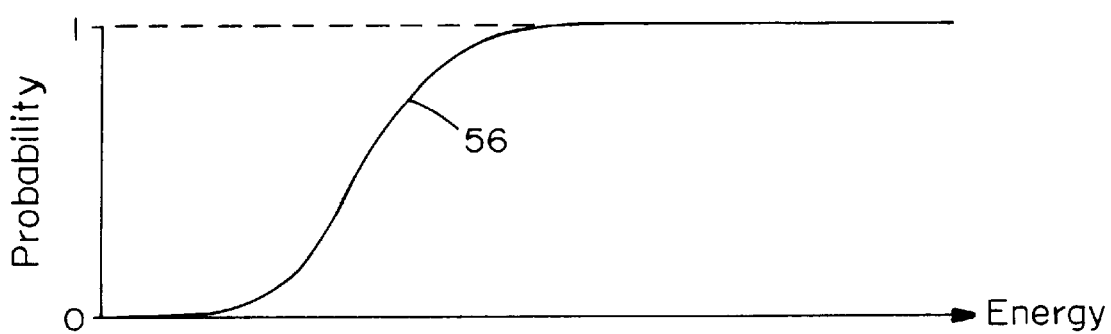
FIG. 12 is a chart illustrating the approximate shape of a cumulative probability function measuring the likelihood that a circuit will be cut over a range of energy levels.
Figure 13:
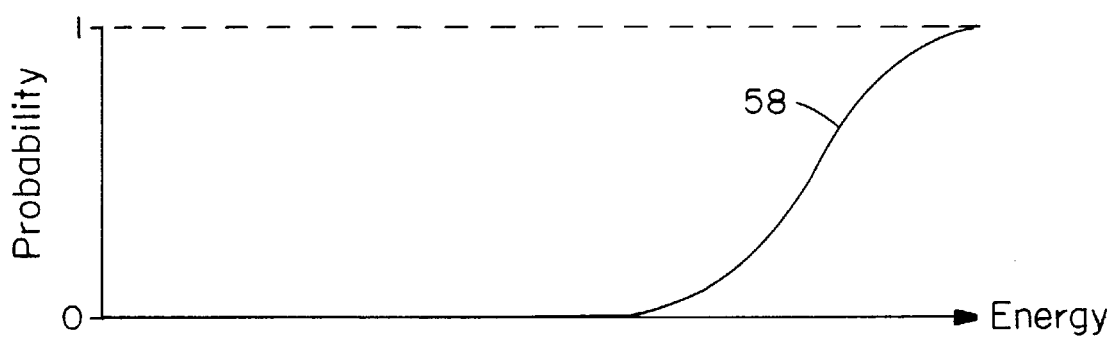
FIG. 13 is a chart illustrating the approximate shape of a cumulative probability function measuring the likelihood that the integrated circuit will be damaged over the same range of energy levels depicted in FIG. 12.
Figure 14:
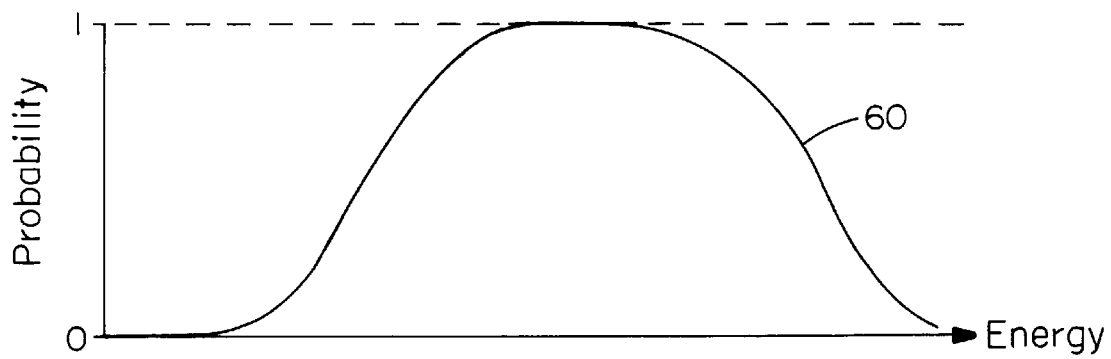
FIG. 14 is a chart illustrating the approximate shape of the combined cumulative probability that a circuit will be cut without otherwise damaging the circuit over the same range of energy levels charted in FIGS. 12 and 13.

The relation between the amount of laser-supplied energy and the probability of producing a clean severance of the circuit without damage is illustrated in the generalized cumulative probability functions charted in FIGS. 12–14. FIG. 12 illustrates the approximate shape of a cumulative probability curve 56 measuring the likelihood that a circuit will be severed at increasing energy levels. FIG. 13 illustrates the approximate shape of a cumulative probability curve 58 measuring the likelihood that a circuit will be damaged across a range of increasing energy levels. By subtracting the probability of damaging a circuit from the probability of severing a circuit (i.e., by subtracting the values of the chart in FIG. 13 from the values of the chart in FIG. 12), the probability of clean severance, i.e., severing a circuit without damaging it, is obtained as a function of energy. A curver 60 approximating the plot of this probability function is charted in FIG. 14. For optimal results, the intensity and duration of the pulse should be set at levels top produce the energy at which the probability of a clean severance most nearly approaches 1.0. The limit of P=1.0 represents a certainty that the circuit will be severed without damage, a limit which can be approached with the methods of this invention.

While this invention has been particularly shown and described with references to preferred embodiments thereof, it will be understood by those skilled in the art that various changes in form and details may be made therein without departing from the scope of the invention as defined by the appended claims.

What is claimed is:

1. A method for cutting a link between interconnected circuits comprising the following steps:

directing a laser upon an electrically-conductive cut-link pad conductively bonded between a first electrically-conductive line and a second electrically-conductive line on a substrate, the cut-link pad having substantially less thermal resistance per unit length than each of the first and second lines, wherein the width of the cut-link pad is at least ten percent greater than the width of each of the first and second electrically-conductive lines; and maintaining the laser upon the cut-link pad until the laser infuses sufficient energy into the cut-link pad to break the conductive link across the cut-link pad between the pair of electrically-conductive lines.

2. The method of claim 1, wherein the electrically-conductive cut-link pad lies in the same plane as the first and second electrically-conductive lines.

3. The method of claim 1, wherein the electrically-conductive cut-link pad has an inner surface facing the substrate and an opposing outer surface facing away from the substrate, the first and second electrically-conductive lines extending from the inner surface into the substrate.

4. The method of claim 3, wherein the laser beam extends across the entirety of the cut-link pad when the laser is directed upon the cut-link pad.

5. The method of claim 1, wherein the electrically-conductive cut-link pad has an inner surface facing the substrate, the first electrically-conductive line extending from the inner surface into the substrate, the second electrically-conductive line lying in the same plane as the cut-link pad.

6. The method of claim 1, wherein the width of the cut-link pad is at least twenty-five percent greater than the width of each of the first and second electrically-conductive lines.

7. The method of claim 1, wherein the width of the cut-link pad is at least fifty percent greater than the width of each of the first and second electrically-conductive lines.

8. The method of claim 7, wherein the cut-link pad is comprised of a composition substantially identical to the composition of the first and second electrically-conductive lines.

9. The method of claim 8, wherein the substrate is planar and the width of the cut-link pad is within 20% of the length of the cut-link pad.

10. The method of claim 9, wherein the laser beam extends across the entirety of the cut-link pad when the laser is directed upon the cut-link pad.

11. A method for cutting a link between interconnected circuits comprising the following steps:

directing a laser upon an electrically-conductive cut-link pad conductively bonded between a first electrically-conductive line and a second electrically-conductive line on a substrate, the cut-link pad having substantially less thermal resistance per unit length than each of the first and second lines, wherein the cut-link pad is formed of a material that has greater thermal conductivity than the material that forms each of the first and second electrically-conductive lines; and maintaining the laser upon the cut-link pad until the laser infuses sufficient energy into the cut-link pad to break the conductive link across the cut-link pad between the pair of electrically-conductive lines.

12. The method of claim 1, wherein the substrate includes a silicon oxide.

13. The method of claim 1, wherein a passivative layer covers the cut-link pad.

14. A method for cutting a link between interconnected circuits comprising the following steps:

directing a laser upon an electrically-conductive cut-link pad conductively bonded between a first electrically-conductive line and a second electrically-conductive line on a substrate, the cut-link pad having substantially less thermal resistance per unit length than each of the first and second lines, wherein the cut-link pad is covered with a passivative layer that is harder than the substrate; and maintaining the laser upon the cut-link pad until the laser infuses sufficient energy into the cut-link pad to break the conductive link across the cut-link pad between the pair of electrically-conductive lines.

15. The method of claim 14, wherein the passivation layer is comprises of silicon nitride.

16. The method of claim 13, wherein the electrically-conductive cut-link pad lies in the same plane as the first and second electrically-conductive lines.

17. The method of claim 13, wherein the electrically-conductive cut-link pad has an inner surface facing the substrate and an opposing outer surface facing away from the substrate, the first and second electrically-conductive lines extending from the inner surface into the substrate.

18. The method of claim 17, wherein the laser beam extends across the entirety of the cut-link pad when the laser is directed upon the cut-link pad.

19. The method of claim 13, wherein the width of the cut-link pad is at least fifty percent greater than the width of each of the first and second electrically-conductive lines.

20. The method of claim 19, wherein the substrate is planar and the width of the cut-link pad is within 20% of the length of the cut-link pad, the length being measured as the distance across the cut-link pad between the first and second lines.

21. The method of claim 13, wherein the cut-link pad is comprised of a material with greater thermal conductivity than the material comprising each of the first and second electrically-conductive lines.

* * * * *

UNITED STATES PATENT AND TRADEMARK OFFICE
CERTIFICATE OF CORRECTION

PATENT NO.        : 6,057,221 C1
APPLICATION NO.   : 90/011607
DATED             : September 11, 2012
INVENTOR(S)       : Joseph B. Bernstein et al.

It is certified that error appears in the above-identified patent and that said Letters Patent is hereby corrected as shown below:

ON THE TITLE PAGE:

After Item "(73) Assignee", change "United States Air Force, Washington, DC (US)" to --Massachusetts Institute of Technology, Cambridge, Mass.; University of Maryland, College Park, Md.--.

Signed and Sealed this
Sixteenth Day of October, 2012

David J. Kappos
*Director of the United States Patent and Trademark Office*

(12) EX PARTE REEXAMINATION CERTIFICATE (9289th)
United States Patent
Bernstein et al.

(10) Number: US 6,057,221 C1
(45) Certificate Issued: Sep. 11, 2012

(54) LASER-INDUCED CUTTING OF METAL INTERCONNECT

(75) Inventors: Joseph B. Bernstein, Potomac, MD (US); Zhihui Duan, Erie, PA (US)

(73) Assignee: United States Air Force, Washington, DC (US)

Reexamination Request:
No. 90/011,607, Mar. 30, 2011

Reexamination Certificate for:
Patent No.: 6,057,221
Issued: May 2, 2000
Appl. No.: 08/825,808
Filed: Apr. 3, 1997

(51) Int. Cl.
*H01L 21/44* (2006.01)

(52) U.S. Cl. .................................... 438/601; 438/132
(58) Field of Classification Search .................. None
See application file for complete search history.

(56) References Cited

To view the complete listing of prior art documents cited during the proceeding for Reexamination Control Number 90/011,607, please refer to the USPTO's public Patent Application Information Retrieval (PAIR) system under the Display References tab.

*Primary Examiner* — John Heyman

(57) ABSTRACT

An electrical interconnect includes a substrate having an insulating surface upon which is placed an electrically-conductive cut-link pad and a pair of electrically-conductive lines. The lines are bonded to the cut-link pad and are substantially more resistant to heat flow per unit length than is the cut-link pad. In a preferred embodiment, the thermal resistance per unit length of the cut-link pad is lowered by designing the pad such that its width is greater than the width of either of the lines. A method for cutting a circuit includes directing a laser upon the cut-link pad of an interconnect, as described above. The laser is maintained upon the pad until the cut-link pad is ablated, severing the circuit.

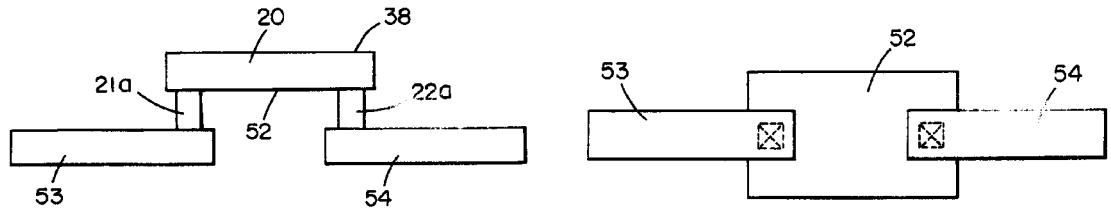

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claim 14 is confirmed.

Claims 1, 2, 5, 9-12, 16, 19 and 20 are cancelled.

Claims 3, 6-8, 13, 15, 17 and 21 are determined to be patentable as amended.

Claims 4 and 18, dependent on an amended claim, are determined to be patentable.

New claims 22-29 and 30 are added and determined to be patentable.

3. [The] *A* method [of claim 1] *for cutting a link between interconnected circuits, comprising the following steps:*

*directing a laser upon an electrically-conductive cutlink pad conductively bonded between a first electrically-conductive line and a second electrically-conductive line on a substrate, the cut-link pad having substantially less thermal resistance per unit length than each of the first and second lines, wherein the width of the cut-link pad is at least ten percent greater than the width of each of the first and second electrically-conductive lines; and*

*maintaining the laser upon the cut-link pad until the laser infuses sufficient energy into the cut-link pad to break the conductive link across the cut-link pad between the pair of electrically-conductive lines, wherein the electrically-conductive cut-link pad has an inner surface facing the substrate and an opposing outer surface facing away from the substrate, the first and second electrically-conductive lines extending from the inner surface into the substrate.*

6. The method of claim [1] *3*, wherein the width of the cut-link pad is at least twenty-five percent greater than the width of each of the first and second electrically-conductive lines.

7. The method of claim [1] *3*, wherein the width of the cut-link pad is at least fifty percent greater than the width of each of the first and second electrically-conductive lines.

8. The method of claim 7, wherein the cut-link pad [is comprised of] *comprises* a composition substantially identical to the composition of the first and second electrically-conductive lines.

13. The method of claim [1] *3*, wherein a passivative layer covers the cut-link pad.

15. The method of claim 14, wherein the passivation layer [is] comprises [of] silicon nitride.

17. [The] *A* method [of claim 1] *for cutting a link between interconnected circuits, comprising the following steps:*

*directing a laser upon an electrically-conductive cutlink pad conductively bonded between a first electrically-conductive line and a second electrically-conductive line on a substrate, the cut-link pad having substantially less thermal resistance per unit length than each of the first and second lines, wherein the width of the cut-link pad is at least ten percent greater than the width of each of the first and second electrically-conductive lines; and*

*maintaining the laser upon the cut-link pad until the laser infuses sufficient energy into the cut-link pad to break the conductive link across the cut-link pad between the pair of electrically-conductive lines, wherein a passivative layer covers the cut-link pad, and the electrically-conductive cut-link pad has an inner surface facing the substrate and an opposing outer surface facing away from the substrate, the first and second electrically-conductive lines extending from the inner surface into the substrate.*

21. The method of claim 13, wherein the cut-link pad [is comprised of] *comprises* a material with greater thermal conductivity than the material comprising each of the first and second electrically-conductive lines.

*22. The method of claim 21, wherein the cut-link pad comprises aluminum.*

*23. The method of claim 3, wherein the cut-link pad has a greater cross-sectional area than the first and second electrically-conductive lines, wherein the cross-sectional area of the cut-link pad is the product of a width and a height of the cut-link pad, the first and second electrically-conductive lines comprise vias, and the cross-sectional area of each of the first and second electrically-conductive lines is defined by a width of the corresponding via.*

*24. The method of claim 13, wherein the passivative layer comprises silicon nitride.*

*25. The method of claim 4, wherein the cut-link pad has a length of 2-3 microns, and the first and second electrically-conductive lines each have a width of about 0.5 microns.*

*26. A method for cutting a link between interconnected circuits comprising:*

*directing a laser upon an electrically-conductive cut-link pad conductivity bonded between a first electrically-conductive line and a second electrically-conductive line on a substrate, the cut-link pad having substantially less thermal resistance per unit length than each of the first and second lines, wherein the cut-link pad is formed of a material that has greater thermal conductively than the material that forms each of the first and second electrically-conductive lines; and*

*maintaining the laser upon the cut-link pad until the laser infuses sufficient energy into the cut-link pad to break the conductive link across the cut-link pad between the pair of electrically-conductive lines, wherein the electrically-conductive cut-link pad has an inner surface facing the substrate and an opposing outer surface facing away from the substrate, the first and second electrically-conductive lines extending from the inner surface into the substrate.*

*27. The method of claim 26, further comprising a passivative silicon nitride layer that covers the cut-link pad.*

*28. The method of claim 26, wherein the cut-link pad comprises aluminum.*

*29. The method of claim 14, wherein the width of the cut-link pad is at least fifty percent greater than the width of each of the first and second electrically-conductive lines.*

*30. The method of claim 13, wherein the passivative layer is harder than the substrate.*

* * * * *